(12) United States Patent
Davey et al.

(10) Patent No.: US 12,391,409 B2
(45) Date of Patent: Aug. 19, 2025

(54) ROCKET THRUST STRUCTURE ASSEMBLY, AND ASSOCIATED SYSTEMS AND METHODS

(71) Applicant: Blue Origin Manufacturing, LLC, Huntsville, AL (US)

(72) Inventors: Robert Allen Davey, Seattle, WA (US); James A. DeLand, Selah, WA (US); Barry Theophile Cooke, Black Diamond, WA (US); Michael D. Richardson, Mukilteo, WA (US); Christopher C. Hamlet, Titusville, FL (US); Max L. Mayfield, Rockledge, FL (US); Joseph J. McGahhey, Des Moines, WA (US); Dario I. Valenzuela, Merritt Island, FL (US); Gavin R. Ryan, Mercer Island, WA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 0 days.

(21) Appl. No.: 18/354,583

(22) Filed: Jul. 18, 2023

(65) Prior Publication Data

US 2025/0026500 A1  Jan. 23, 2025

(51) Int. Cl.
*B64G 1/40* (2006.01)
*B64F 5/00* (2017.01)
(Continued)

(52) U.S. Cl.
CPC .............. *B64G 1/4022* (2023.08); *B64F 5/00* (2013.01); *B64F 5/10* (2017.01); *G05B 19/41805* (2013.01); *G06F 30/15* (2020.01)

(58) Field of Classification Search
CPC ..................................... B64F 5/00; B64F 5/10
See application file for complete search history.

(56) References Cited

U.S. PATENT DOCUMENTS 6,480,271 B1  11/2002  Cloud et al.
6,618,505 B2  9/2003  Cork et al.
(Continued)

OTHER PUBLICATIONS

Jin et al., "Configuration Analysis of the ERS Points in Large-Volume Metrology System," Sensors—ISSN 1424-8820, www.mdpi.com/journal/sensors, 2015, 12 pages.
(Continued)

*Primary Examiner* — Richard G Davis
(74) *Attorney, Agent, or Firm* — Hogan Lovells US LLP

(57) ABSTRACT

Aerospace systems, and systems and methods for assembling an aerospace system or another system or structure, are disclosed. A representative system can include a propellant tank with a dome-shaped head; attachment features on the dome-shaped head; and a thrust structure with legs attached to the attachment features. A representative method can include forming shims to be positioned between the legs and the attachment features. The shims can be formed based on digital characterizations of mounting faces on the attachment features within a reference coordinate system. The method can include positioning a drill jig within the reference coordinate system and using the drill jig to make holes in the shims and/or the attachment features for fastening the legs to the attachment features. A drill jig can include plates that are movable relative to each other. At least one of the plates can include a mounting hole pattern.

16 Claims, 13 Drawing Sheets

(51) Int. Cl.
    *B64F 5/10*         (2017.01)
    *G05B 19/418*   (2006.01)
    *G06F 30/15*     (2020.01)

(56) References Cited

U.S. PATENT DOCUMENTS

| | | |
|---|---|---|
| 7,756,321 B2 | 7/2010 | Marsh et al. |
| 8,756,792 B2 | 6/2014 | Boyl-Davis |
| 9,068,809 B1 | 6/2015 | Lagally et al. |
| 9,347,400 B2 | 5/2016 | Jaeger et al. |
| 9,429,935 B2 | 8/2016 | Boyl-Davis |
| 2002/0066192 A1 | 6/2002 | Cunningham |
| 2007/0263229 A1 | 11/2007 | Marsh |
| 2014/0103164 A1 | 4/2014 | Aston et al. |

OTHER PUBLICATIONS

S-IVB (Saturn V) Overview, http://heroicrelics.org/info/s-ivb/s-ivb-v-overview.html, accessed Mar. 21, 2025, 5 pages.
S-IVB Thrust Structure, U.S. Space and Rocket Center Site Index, Saturn V S-IVB (Third) Stage Gallery, dsc00265.jpg, http://heroicrelics.org/ussrc/s-ivb/dsc00265.jpg.html, Jul. 2009, 1 page.

ROCKET THRUST STRUCTURE ASSEMBLY, AND ASSOCIATED SYSTEMS AND METHODS

TECHNICAL FIELD

The present disclosure is directed generally to systems and methods for assembling a structure, such as an aerospace system including a rocket system and/or a launch vehicle. Representative features of the present disclosure include measuring elements of the structure and positioning mounting holes based at least in part on the measurements.

BACKGROUND

Rockets have been used for many years to launch human and non-human payloads into orbit. Such rockets delivered the first humans to space and to the Moon, and have launched countless satellites into the Earth's orbit and beyond. Such rockets are used to propel uncrewed space probes to deliver structures, supplies, and personnel to the orbiting International Space Station.

Aerospace systems, such as rocket systems, often require high degrees of precision among large components. However, large components and assemblies of large components are often difficult to build to ideal degrees of precision due to their size. For example, one challenge associated with building a rocket is the need to connect the rocket engine and interfacing structural hardware to the remainder of the rocket assembly in a precise manner that enables thrust forces from the rocket engine to reliably and safely move the rocket assembly. Assembly methods that offer high production throughput and reduce the need for monumental assembly fixtures are desired.

For example, some systems require Class 1 tolerances, which may mean that a bolt is only 0.005 inches smaller in diameter than a corresponding fastener hole. This level of tolerance requires extreme control if a manufacturer wants to pre-drill a pattern of holes. Such control is often achieved by match-drilling holes. But match drilling is not always possible, for example, in circumstances when tools cannot access spaces to be drilled, or for other reasons.

Embodiments of the present technology are directed to addressing these challenges and other challenges.

BRIEF DESCRIPTION OF THE DRAWINGS

In the drawings, wherein the same reference number indicates the same element throughout the views:

FIG. 7A illustrates a partially schematic perspective view, FIG. 7B illustrates a partially schematic bottom view, and FIG. 7C illustrates an exploded perspective view.

DETAILED DESCRIPTION

Figure 1:
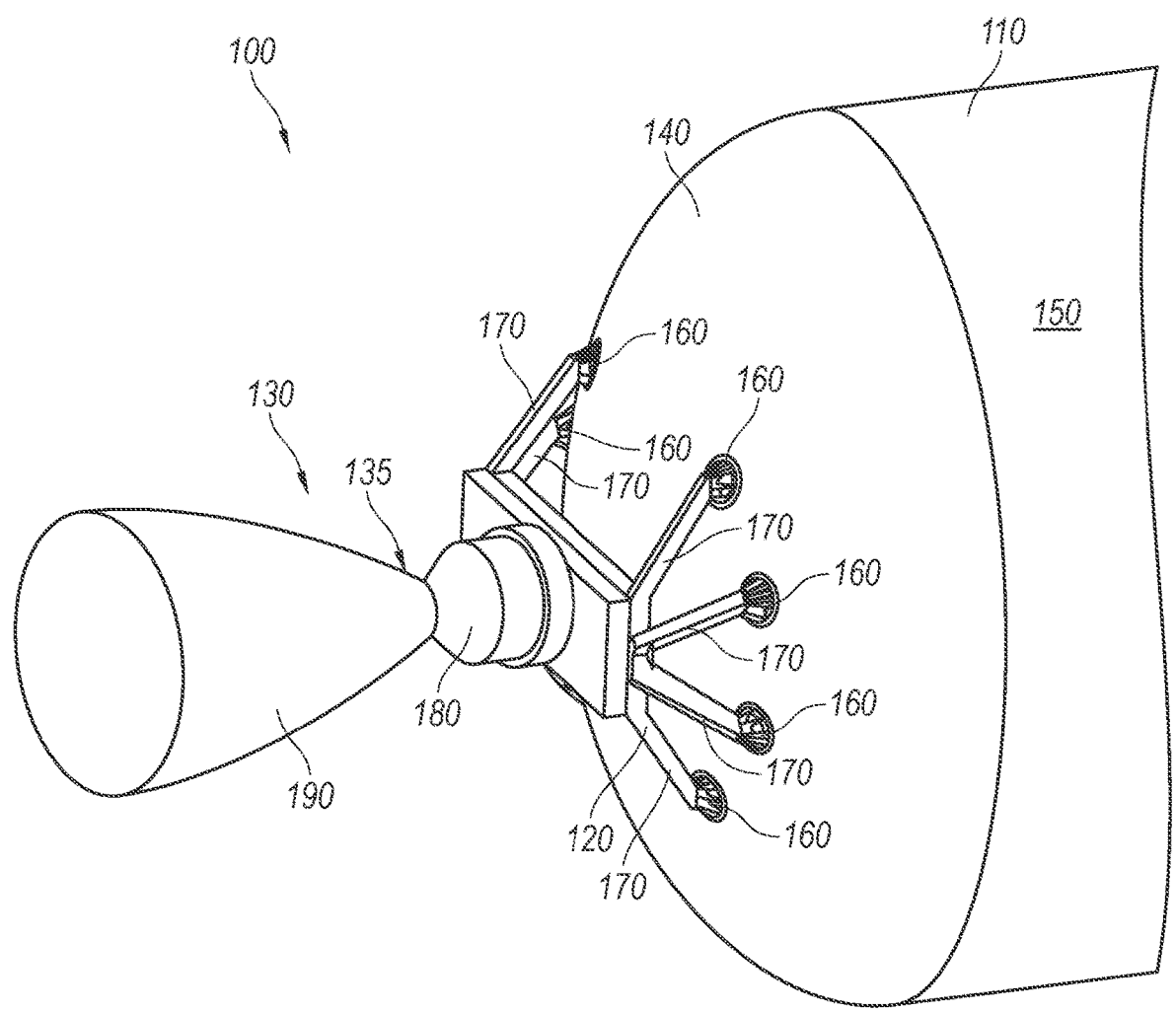
FIG. 1 illustrates a partially schematic perspective view of a rear portion of an aerospace system (e.g., a rocket system), configured in accordance with embodiments of the present technology.

Embodiments of the technology disclosed herein are directed generally to systems and methods for assembling a structure, such as attaching a first structure portion to a second structure portion. For example, several embodiments are directed to assembling a rocket system by securing a rocket engine thrust structure to a rocket fuel tank structure. Although specific implementations of the present technology can include an aerospace system, such as a rocket system and/or launch vehicle, the present technology can also be implemented in other systems in which precise attachment between two or more objects is desired.

The present technology enables precise connection between a first component (e.g., a thrust structure) and a second component (e.g., a rocket fuel tank) despite imprecise alignment of attachment features (e.g., due to manufacturing tolerances). In other words, embodiments of the present technology reduce (e.g., minimize) tolerances in large assemblies such as aerospace systems and/or rocket systems. Embodiments of the present technology enable, for example, Class 1 tolerance levels without having to "match drill" components.

INTRODUCTION

In general, embodiments of the present technology can include using metrology and fabrication processes to create a nominal interface, and then using systems to position and integrate two items at the nominal interface. Items for integration can include assemblies with structures, fluids, avionics hardware, and/or other combinations of components. Integration features for joining items at the interface can include surfaces, bolted joints, mating hole patterns, and other elements suitable for joining items together.

Some embodiments of the present technology, which are described below in further detail in connection with the Figures, include characterizing (e.g., modeling, measuring, and/or otherwise characterizing) attachment features of a real-world interface using a metrology system, determining variation between the real-world features and nominal features, then creating a shim and/or using a drill jig to correct the variation before attaching the components at the interface. Digital aspects and modeling in the present technology can reduce reliance on large monumental tooling and overhead cranes.

Suitable metrology/measurement systems can include total station systems, laser trackers, laser radars, surface scanners (e.g., "blue light" scanners), portable coordinate measurement systems (e.g., those with a CMM tip and a group of reflective elements), photogrammetry, and/or other suitable measurement systems. Accordingly, suitable measurement systems include those that can measure distance and/or characterize surface shapes and/or positions, including systems available from Leica Geosystems AG or Nikon Metrology Inc, and/or other sources. Laser-based processes are described in specific embodiments below in more detail, but any suitable metrology/measurement system can be used in the various embodiments.

For example, some embodiments of the present technology can include attaching a plurality of optical targets (such as a constellation of the optical targets in a pattern) onto an item or structure to characterize its as-built (real-world) condition. Such characterization enables determining the accumulation of tolerances on the interface and enables understanding the deviation of the as-built interface relative to the nominal (desired) interface. For example, after the characterization process, the method can include aligning measurement data to a computer-aided design (CAD) based reference system to determine and correct variations between the as-built condition and the nominal (desired) condition.

In a representative application, a first part to be attached is static, while a second part to be attached is movable relative to the first part. The fixed part is measured and characterized, then the second part is measured and characterized, the parts are virtually assembled in software, and then physically assembled (e.g., by attaching the second part to the first part) with tooling.

A representative method of assembling an aerospace system can include positioning a plurality of optical targets for a measurement system on a body portion of the aerospace system, and determining a position and orientation of the measurement system relative to the body portion in a reference coordinate system. Within the reference coordinate system, and using the measurement system, the method can further include scanning and characterizing a plurality of first mounting faces on attachment features positioned on the body portion, forming a digital representation of each of the first mounting faces within the reference coordinate system, and, based on the digital representation of each of the one or more first mounting faces, defining and/or forming one or more shims, such that when each shim is positioned on a corresponding first mounting face, the shim forms a corresponding new mounting face. Each of the new mounting faces can be coplanar within the reference coordinate system. In some embodiments, a method can further include positioning each shim on each corresponding first mounting face, and positioning a drill jig over a selected shim from the one or more shims. The drill jig can include a hole pattern. The method can further include adjusting the drill jig to position the hole pattern within the reference coordinate system, and making holes based on the hole pattern. The new surfaces created by the shims creates a new structural interface and minimizes (e.g., eliminates) the variation presented by the assembly. In some embodiments, the aerospace system can include a rocket engine thrust structure having a plurality of legs (e.g., structural beams), and the method can further include attaching each leg to a first mounting face or a new mounting face with the holes (e.g., using fasteners through the holes).

A representative aerospace system can include a body portion (such as a tank for storing fuel, oxidizer, and/or other propellant materials) having an elongated cylinder and a dome-shaped head attached to an end of the elongated cylinder; a plurality of attachment features positioned on the dome-shaped head; and a thrust structure with a plurality of legs. Each leg can be positioned and configured to be attached to a corresponding mounting foot on the dome-shaped head. Mounting interfaces between the attachment features and the legs can be coplanar. The system can include a rocket engine carried by the thrust structure, and the mounting interfaces and the thrust structure can be the only structural support for the rocket engine on the dome-shaped head.

A further representative system can include a jig (e.g., a drill jig) for aligning a template for holes to be made in a surface (such as a surface of an attachment feature for attaching a thrust structure to a portion of a rocket system). The drill jig can include: a rotatable plate with a hole pattern configured to position the holes to be made; a first translatable plate; a second translatable plate; and a base plate with one or more attachment elements positioned and configured to grasp the supporting element. The second translatable plate can be supported on the base plate and translatable relative to the base plate along a first axis; the first translatable plate can be supported on the second translatable plate and translatable relative to the second translatable plate along a second axis that is transverse to the first axis; and the rotatable plate can be supported on the first translatable plate and rotatable relative to the first translatable plate about a third axis that is orthogonal to the first axis and the second axis.

Several details describing structures and processes that are well-known and often associated with metrology and launch vehicles are not set forth in the following description to avoid obscuring other aspects of the disclosure. Moreover, although the following disclosure sets forth several embodiments, several other embodiments can have configurations, arrangements, and/or components that are different than those described in this section. In particular, other embodiments may have additional elements, and/or may lack one or more of the elements described below with reference to FIGS. 1-12.

Example Implementations of the Present Technology

FIG. 1 illustrates a partially schematic perspective view of a rear portion of an aerospace system, more specifically a rocket system 100, configured in accordance with embodiments of the present technology. In some embodiments, the rocket system 100 includes a body portion 110, a thrust structure 120, and a propulsion system 130. In some embodiments, the body portion 110 can include a tank for storing fuel, oxidizer, other propellant, and/or other materials. For example, in some embodiments, the body portion 110 includes a head 140 attached to an end of an elongated cylinder 150. In some embodiments, the head 140 can be dome-shaped, such as the aft dome of a rocket tank. In some embodiments, the head 140 can have other shapes. The head 140 can carry a plurality of attachment features 160, such as eight attachment features 160 or another suitable number of attachment features 160. The attachment features 160 can be (or can include) mounting feet or other features suitable for forming a mounting location for other structural elements. The thrust structure 120 can include a corresponding number of legs 170, each leg 170 positioned and configured to be attached to the attachment features 160. The legs 170 can include one or more structural beams and/or other structural devices suitable for carrying loads. The thrust structure 120 supports at least a portion of the propulsion system 130 and transmits thrust forces from the propulsion system 130 to the body portion 110. The propulsion system 130 can include any propulsion system suitable for propelling a rocket system, such as a rocket engine 135 having a combustion chamber 180 and a nozzle 190. The thrust structure 120 can carry the combustion chamber 180, the nozzle 190, and/or other elements of a rocket engine such as one or more pumps, one or more gimbals, and/or other aspects of a propulsion system.

Accordingly, in some representative embodiments, the body portion 110 is (or includes) a fuel, oxidizer, and/or propellant tank; the thrust structure 120 is mounted to the head 140 of the propellant tank via the attachment features 160; and the rocket engine 135 receives fuel, oxidizer, or other propellant from the tank to generate thrust to propel the rocket system 100. In such embodiments, and in similar embodiments, the thrust structure 120 transfers thrust directly to the head 140 of the body portion 110 (i.e., the propellant tank) via the attachment features 160. Advantages of such an arrangement (in which the thrust structure 120 is mounted directly on the head 140 of a tank), include reduced weight and more standardization of the fabrication and/or assembly of the overall structure. For example, embodiments of the present technology can use fewer components relative to conventional designs, such as conventional designs in which the thrust structure is attached to or integrated with an aft skirt (rather than being more directly mounted to the tank). Further, mounting the thrust structure 120 to the head 140 without an aft skirt enables designers to use a common shape and/or profile for different heads on different tanks, which enables cost savings by reducing the number of unique tools and fixtures required for assembly.

Figure 2:
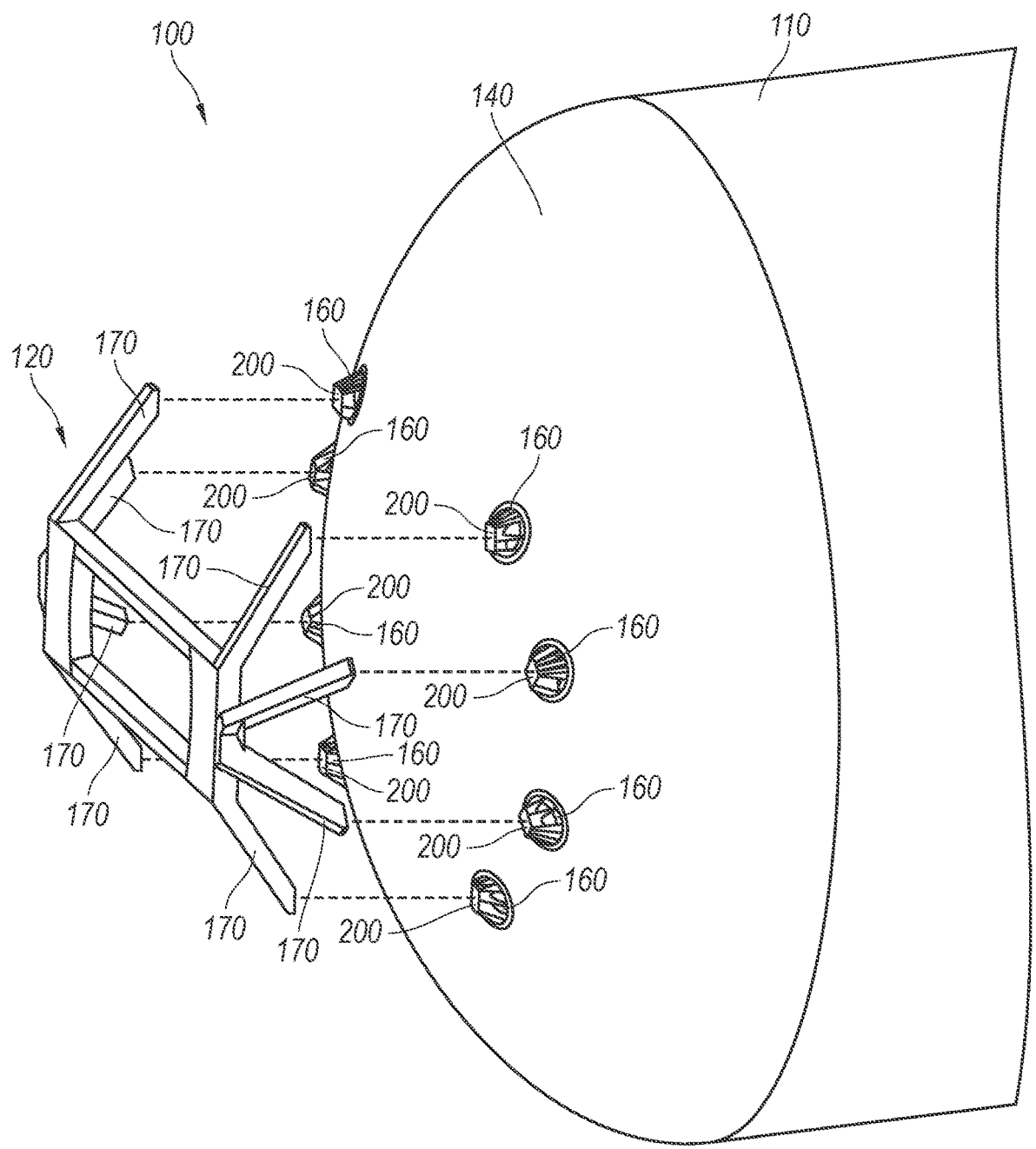
FIG. 2 illustrates a partially schematic exploded view of a portion of the rocket system, showing the relationship between a rocket engine thrust structure and attachment features on a head of a body portion of a rocket.

FIG. 2 illustrates a partially schematic exploded view of a portion of the rocket system 100, showing the relationship between the thrust structure 120 and the attachment features 160 on the head 140 of the body portion 110. The legs 170 of the thrust structure 120 are configured to fasten to the attachment features 160 using bolts or other suitable fasteners. However, because of limitations in manufacturing tolerances for the body portion 110, the head 140, and/or the attachment features 160 (such as weld distortion, hole position, surface profiles, and/or other variables), mounting faces 200 of the attachment features 160 may not be flat, may not be in the same plane, and/or may not be sufficiently aligned with the corresponding legs 170 of the thrust structure 120. As a result, using pre-drilled fastener holes on the legs 170 and the attachment features 160 would present a risk of misalignment. It may also be unwieldy and/or insufficiently precise to try to align the thrust structure 120 with the attachment features 160 to determine a correct location for mounting holes in the attachment features 160. In some circumstances, there may not be sufficient tool access to drill on the assembly. Accordingly, connecting the thrust structure 120 to the body portion 110 with precision presents challenges associated with alignment, fastener positioning, and/or other manufacturing processes. Embodiments of the present technology address these challenges and/or other challenges.

Figure 3:
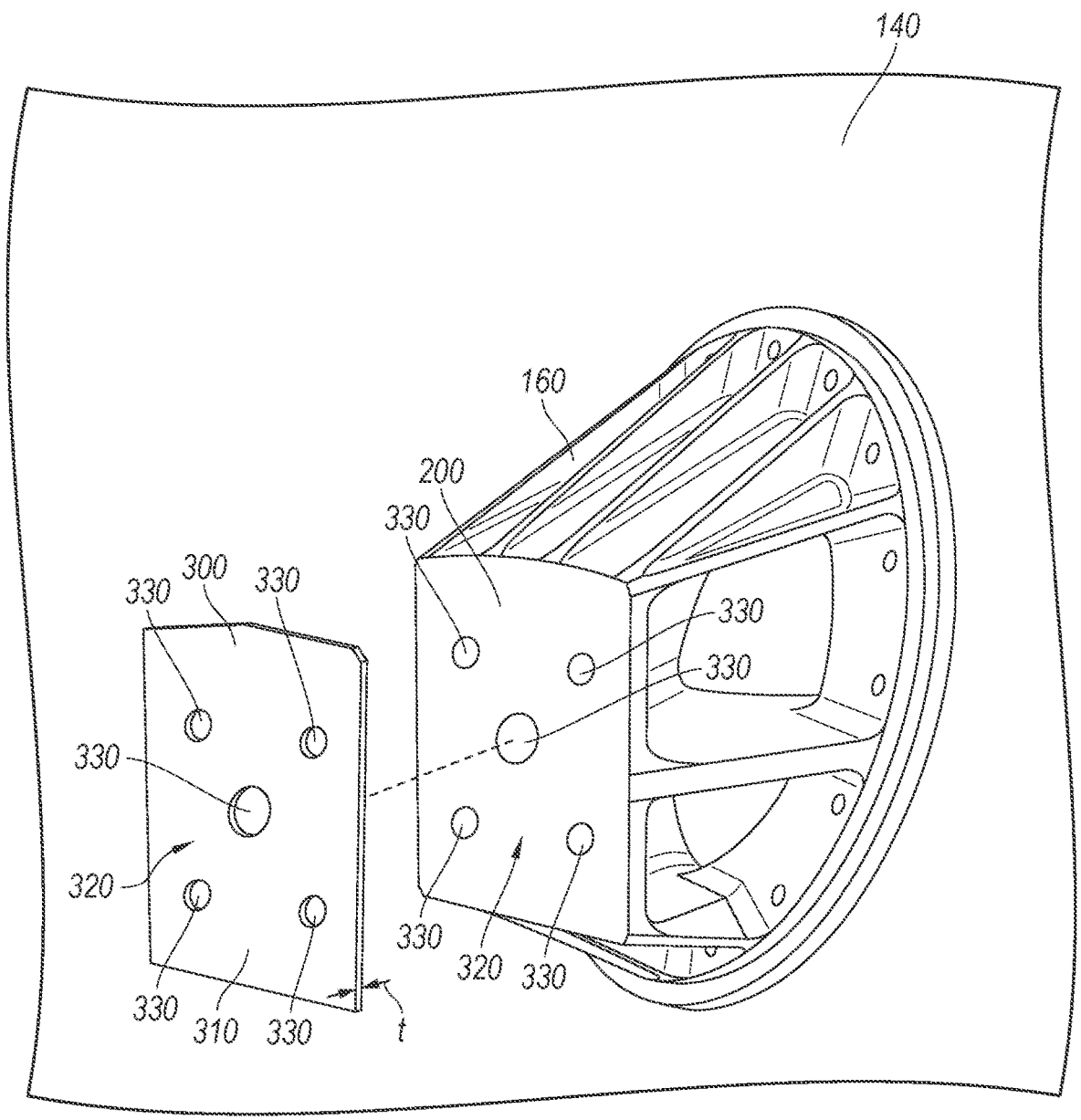
FIG. 3 illustrates a partially schematic view of a shim and an attachment feature configured in accordance with embodiments of the present technology.

FIG. 3 illustrates a partially schematic perspective view of a shim 300 and one of the attachment features 160 configured in accordance with embodiments of the present technology. To account for the mounting faces 200 of each attachment feature 160 being out of plane from one another (non-coplanar) and/or having a shape that does not adequately conform to the intended design, a shim 300 having a thickness t can be positioned on the mounting face 200. The thickness t need not be uniform over the entirety of the shim 300 (e.g., a shim 300 can have variable thickness and/or it may be contoured where it contacts the mounting face 200, to match the contour of the mounting face 200). Shims 300 of various thicknesses t on one or more (such as all) of the attachment features 160 create new mounting faces 310 that are generally in the same plane (i.e., coplanar, within acceptable tolerances). Accordingly, between each leg 170 (see FIGS. 1 and 2) and its corresponding attachment feature 160, is a mounting interface formed by either the mounting face 200 on the attachment feature 160 or the new mounting face 310, and the mounting interfaces can all be coplanar to precisely and accurately mount the thrust structure 120 to the head 140. In some embodiments, such mounting interfaces, along with the thrust structure 120, are the only structural support for the rocket engine 135 on the head 140. In other words, in some embodiments, the thrust structure 120 carries the rocket engine 135, and the attachment features 160 (with any optional shims 300) carry the thrust structure 120, such that the thrust structure 120 is essentially mounted to the head 140.

The shims 300 can be fixed to the mounting face 200 of each attachment feature 160 using an adhesive, such as a two-sided tape material and/or another suitable adhesive material. When the shims 300 are fixed to the mounting face 200 of each attachment feature 160 and the new mounting faces 310 are generally in the same plane as each other and/or in the same plane as the mounting faces 200 (coplanar), a mounting hole pattern 320 including one or more mounting holes 330 can be made (e.g., drilled and/or cut) through each shim 300 and/or mounting face 200 using a metrology process and a drill jig to accurately position the mounting holes 330. Metrology processes and drill jigs configured in accordance with embodiments of the present technology are described below with reference to FIGS. 4 through 9.

Figure 4:
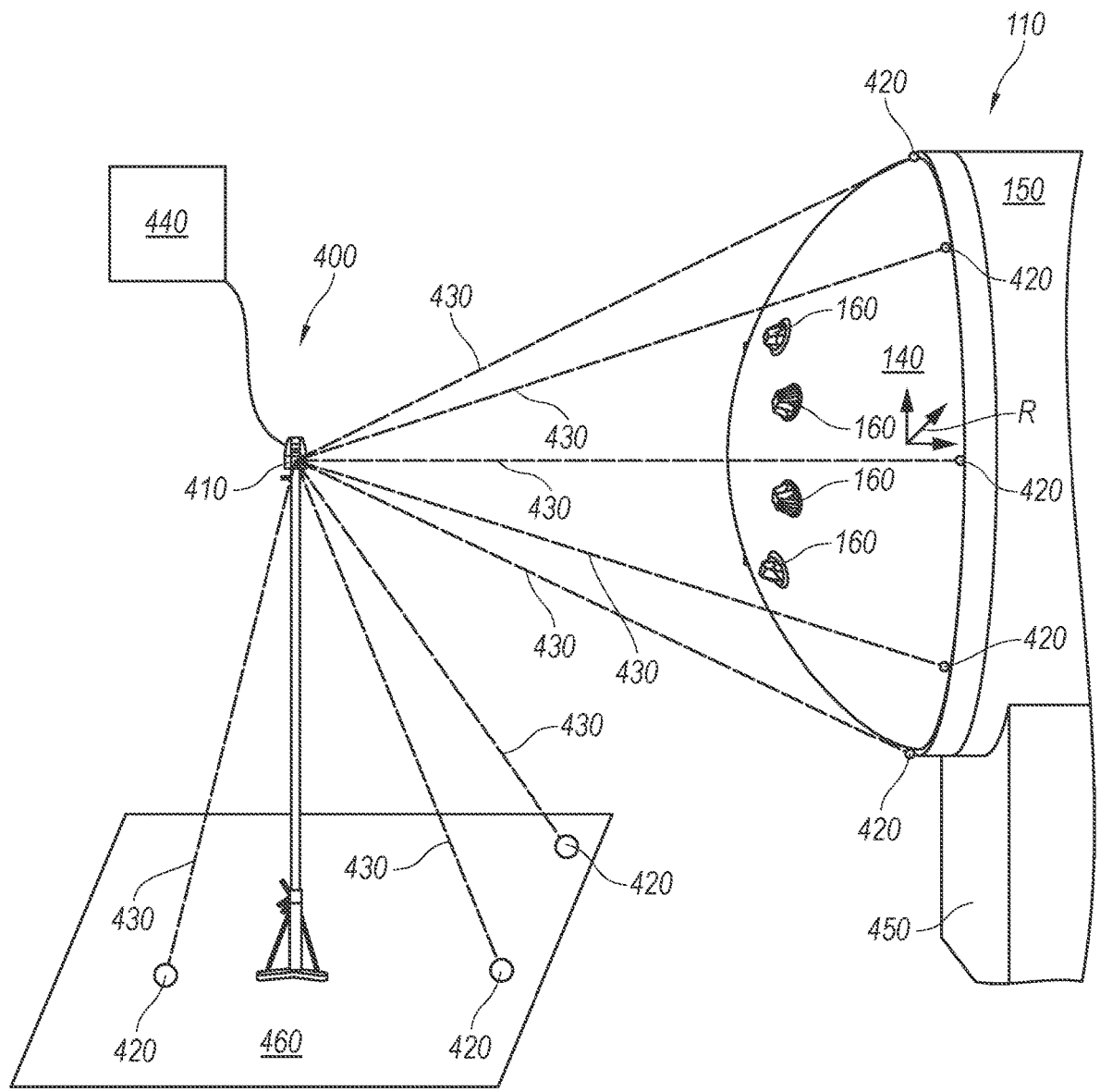
FIG. 4 illustrates a partially schematic side view of a system for positioning shims and mounting holes, configured in accordance with embodiments of the present technology.

Metrology Processes and Drill Jigs According to Embodiments of the Present Technology FIG. 4 illustrates a partially schematic side view of a system 400 for positioning the shims 300 (see FIG. 3) and the mounting holes 330 (see FIG. 3), configured in accordance with embodiments of the present technology. In some embodiments, the system 400 can include a measurement system 410, such as a laser tracker, laser radar, and/or another metrology system. The system 400 can further include one or more optical targets 420 (e.g., spherically mounted retroreflectors, and/or other suitable optical targets) configured to reflect light beams 430 (e.g., laser light beams) emitted from the measurement system 410, and one or more computers or computer systems 440 in communication with the measurement system 410. The computers or computer systems 440 can be configured to receive information from the measurement system 410 to determine measurements and coordinate systems associated with the process for positioning the shims 300 and the mounting holes 330. The measurement system 410 and/or the optical targets 420 can include off-the-shelf devices commonly associated with metrology processes and known in the art. The computers or computer systems 440 can include CAD software.

In some embodiments, the body portion 110 may be oriented horizontally and supported by a support structure 450, although in other embodiments, the system 400 can operate—and the process can be performed—in a vertical orientation. In further embodiments, the body portion 110 may be oriented in any other suitable orientation, such that the system 400 can operate—and the process can be performed—in any other suitable orientation. The process can be agnostic to orientations of the structures as long as there is a suitable reference system (e.g., CAD reference system) for alignment.

One aspect of a process according to embodiments of the present technology involves aligning real-world/as-built measurement data from the measurement system 410 with a reference coordinate system in CAD software, in order to determine real-world/as-built deviations from nominal/desired dimensions. In some embodiments, the reference coordinate system can correspond with the nominal rocket coordinate system R (the coordinate system R is drawn generally arbitrarily in FIG. 4, and it can have an origin in any suitable location, with any suitable orientation). Accordingly, in some embodiments, a step of the process can include determining the position of the measurement system 410 relative to the as-built condition of a portion of the rocket, such as the body portion 110. This enables the CAD software to coordinate later measurements of the measurement system 410 with the nominal rocket coordinate system in the software.

In some embodiments, a plurality of the optical targets 420 (e.g., eight optical targets 420, or another suitable number) can be positioned around a perimeter (e.g., a circumferential perimeter) of the head 140, such as at a flange (e.g., a tank adapter flange) or other fixed element of the body portion 110. In some embodiments, an origin of the reference coordinate system (e.g., the nominal rocket coordinate system R) can be the center of the pattern of optical targets 420 around the head 140.

The measurement system 410 emits and/or directs the light beams 430 toward each of the optical targets 420 on the body portion 110 and determines the angle and distance between the measurement system 410 and each of the optical targets 420 on the body portion 110 to determine the position and orientation of the measurement system 410 relative to the body portion 110, within the reference coordinate system (e.g., the nominal rocket coordinate system R). CAD software (such as SpatialAnayzer® by New River Kinematics, Inc.) can align the data from the measurement system 410 with the virtual (CAD) model of the nominal body portion 110.

Optionally, one or more additional optical targets 420 (e.g., three optical targets 420, or another suitable number) may be positioned on a floor of the workspace and/or on one or more other suitable reference surfaces. These additional optical targets 420 on the floor are not necessary in all embodiments, but they can provide a secondary reference coordinate system in the event the measurement system 410 needs to be moved (e.g., if the head 140 or another component to be measured is too large to characterize with the measurement system 410 in one fixed position).

Figure 5:
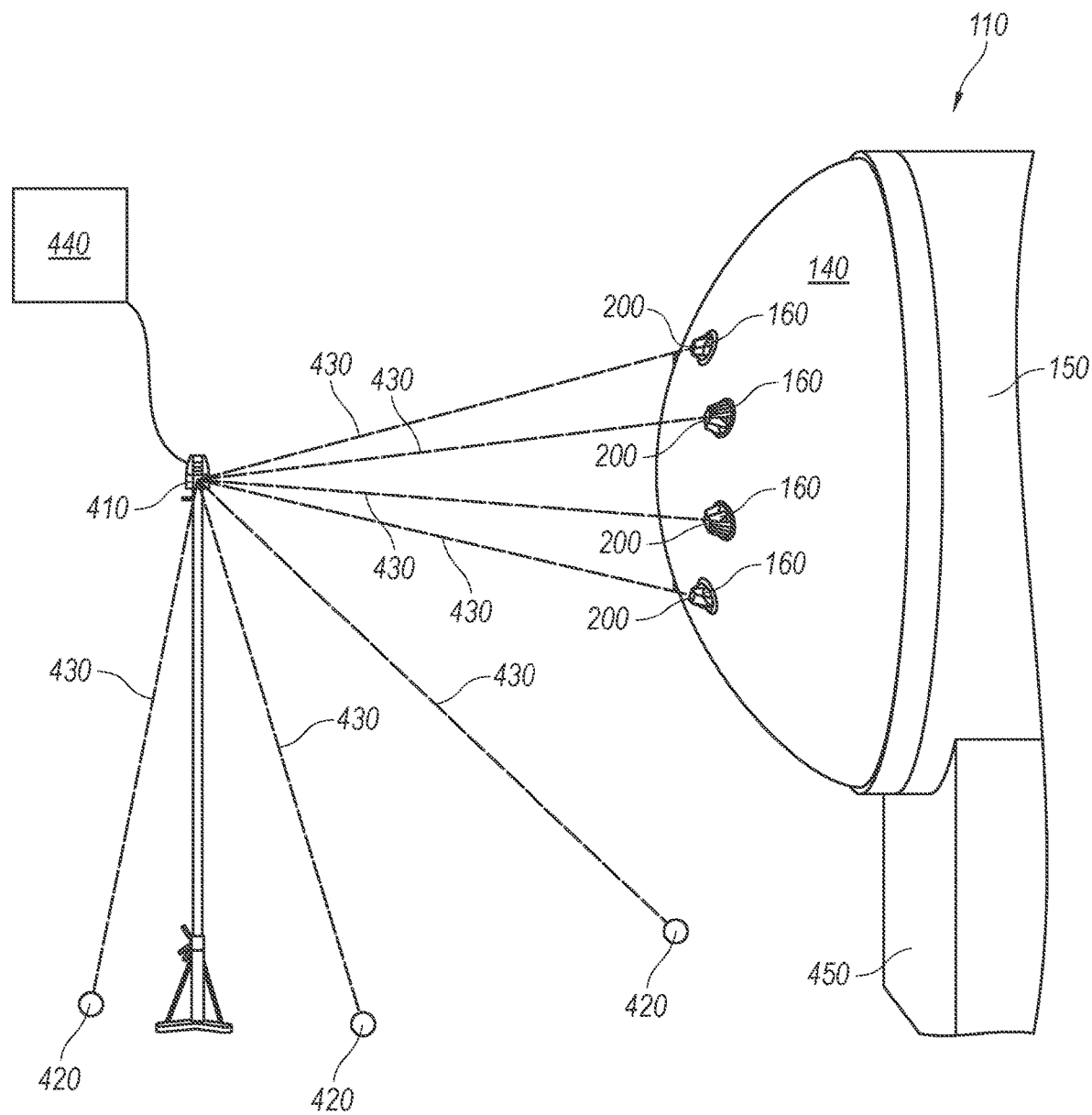
FIG. 5 illustrates a partially schematic side view of the system shown in FIG. 4, in a step of a process for positioning the shims and the holes.

FIG. 5 illustrates a partially schematic side view of the system 400 in a further step of the process for positioning the shims 300 (see FIG. 3) and the mounting holes 330 (see FIG. 3). In some embodiments, the measurement system 410 carries out a point scan of each mounting face 200 of each attachment feature 160, for example, by emitting light beams 430 and analyzing reflections from the mounting faces 200. Data from the scan of each mounting face 200 is positioned in the reference coordinate system (e.g., the nominal rocket coordinate system R) using the CAD software to make a digital representation of the mounting faces 200. Essentially, this is scanning the real-world mounting faces 200 into the CAD model for virtual measurement of the deviations of the as-built mounting faces 200 from the nominal/desired dimensions in CAD. The deviations represent the dimensions the one or more shims 300 (see FIG. 3) need to be in order to create the desired mounting interface.

Figure 6A:
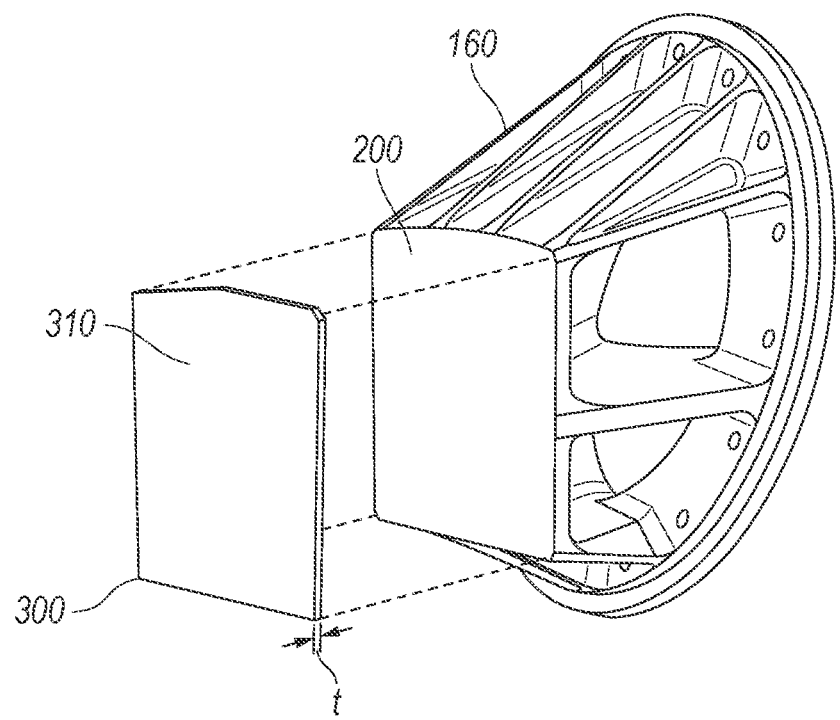
FIG. 6A illustrates a partially schematic perspective view of one of the shims and one of the attachment features prior to, and/or during attachment of the shim to the attachment feature.
Figure 6B:
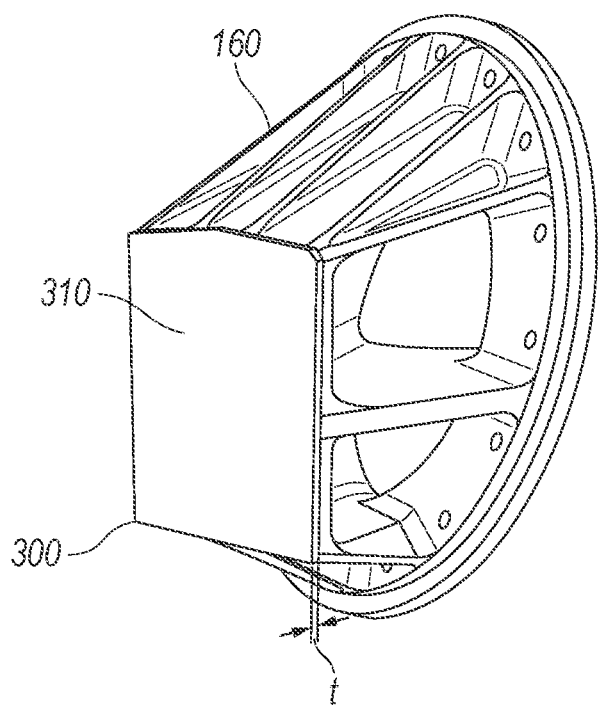
FIG. 6B illustrates a partially schematic perspective view of the shim attached to the attachment feature.

FIG. 6A illustrates a partially schematic perspective view of one of the shims 300 and one of the attachment features 160 prior to, and/or during, attachment of the shim 300 to the attachment feature 160. FIG. 6B illustrates a partially schematic perspective view of the shim 300 fixed to the attachment feature 160. With reference to FIGS. 6A and 6B, and with continuing reference to FIG. 5, based on the digital representation (model) of each mounting face 200, the computer system 440 or an operator may model a shim 300 for one or more of the attachment features 160 that virtually positions the new mounting faces 310 of the shims 300 such that all of the new mounting faces 310 are aligned within and aligned to the same nominal plane (i.e., coplanar) when each shim 300 is attached to a corresponding mounting face 200. The nominal plane can be within the nominal rocket coordinate system R (see FIG. 4).

If a mounting face 200 is already within the nominal plane, a shim may not be necessary. The process continues with the manufacture of each shim 300 in the real world with machining, additive manufacturing, or another suitable manufacturing technique. Then the shim 300 is attached to the mounting face 200 using adhesive, double-sided tape, or another suitable thin bonding material.

In some embodiments, the nominal plane position relative to the original mounting faces 200 can be selected such that no shim 300 is too thin to manufacture. For example, depending on materials for the shim 300 and manufacturing techniques, in some embodiments, the nominal plane position is selected so that no shim has a thickness t that is less than 0.01 inches. In some embodiments, the nominal plane position is selected so that no shim has a thickness t that is greater than 0.1 inches. A shim that is too thick can re-introduce problems with precision and/or can alter the structural loading characteristics of the assembly. A shim that is too thin may be difficult to manufacture.

With the new mounting faces 310 and/or the mounting faces 200 on the attachment features 160 aligned with the nominal plane (e.g., the same plane in the nominal rocket coordinate system R), the process can continue with drilling the mounting holes 330. Drilling the mounting holes 330 can include the use of a jig (such as a drill jig) to accurately position the mounting holes 330. Although a drill jig is described herein as an example tool for drilling the mounting holes 330, in other embodiments, other tools may be used to determine locations for the mounting holes 330 and/or for forming the mounting holes 330.

Figure 7A:
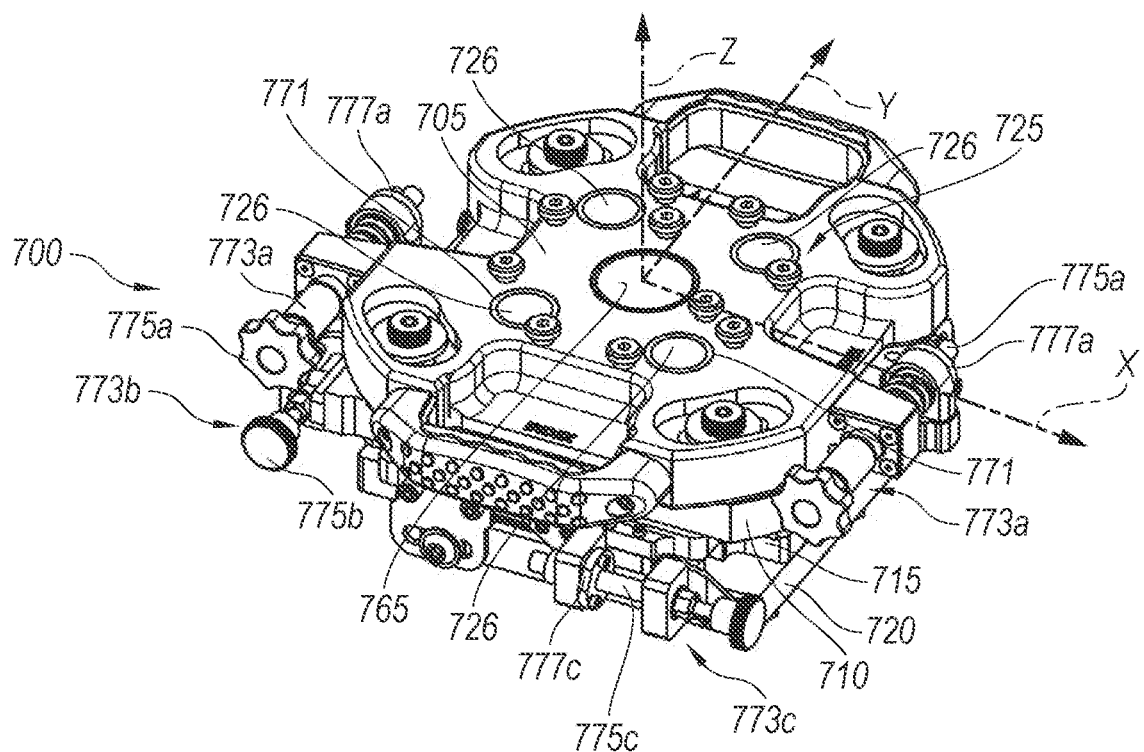
FIGS. 7A, 7B, and 7C illustrate partially schematic views of a drill jig configured in accordance with embodiments of the present technology.
Figure 7B:
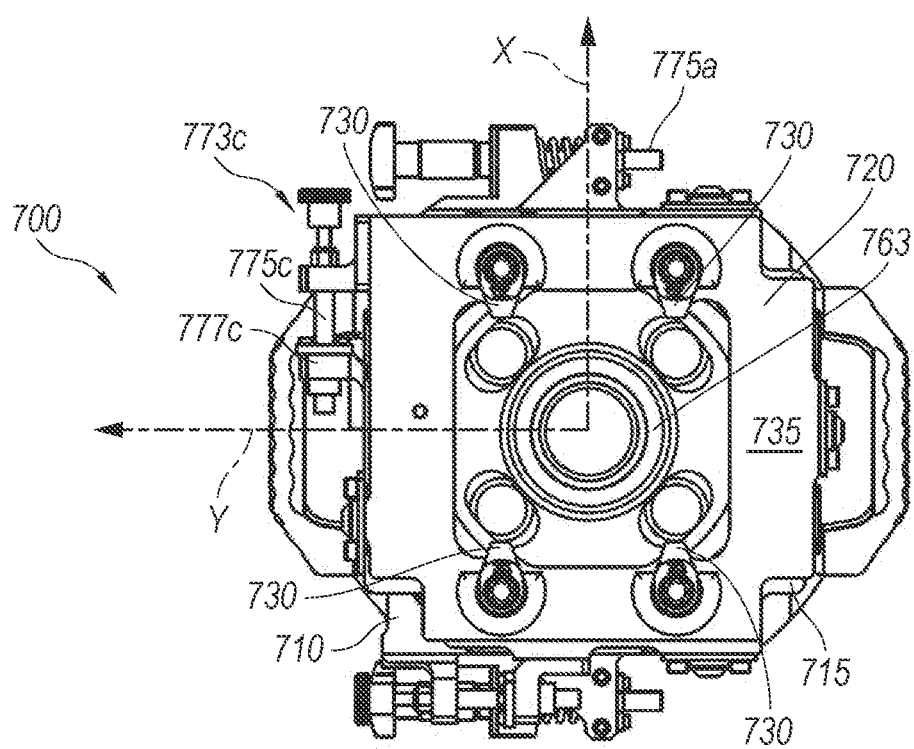
Figure 7C:
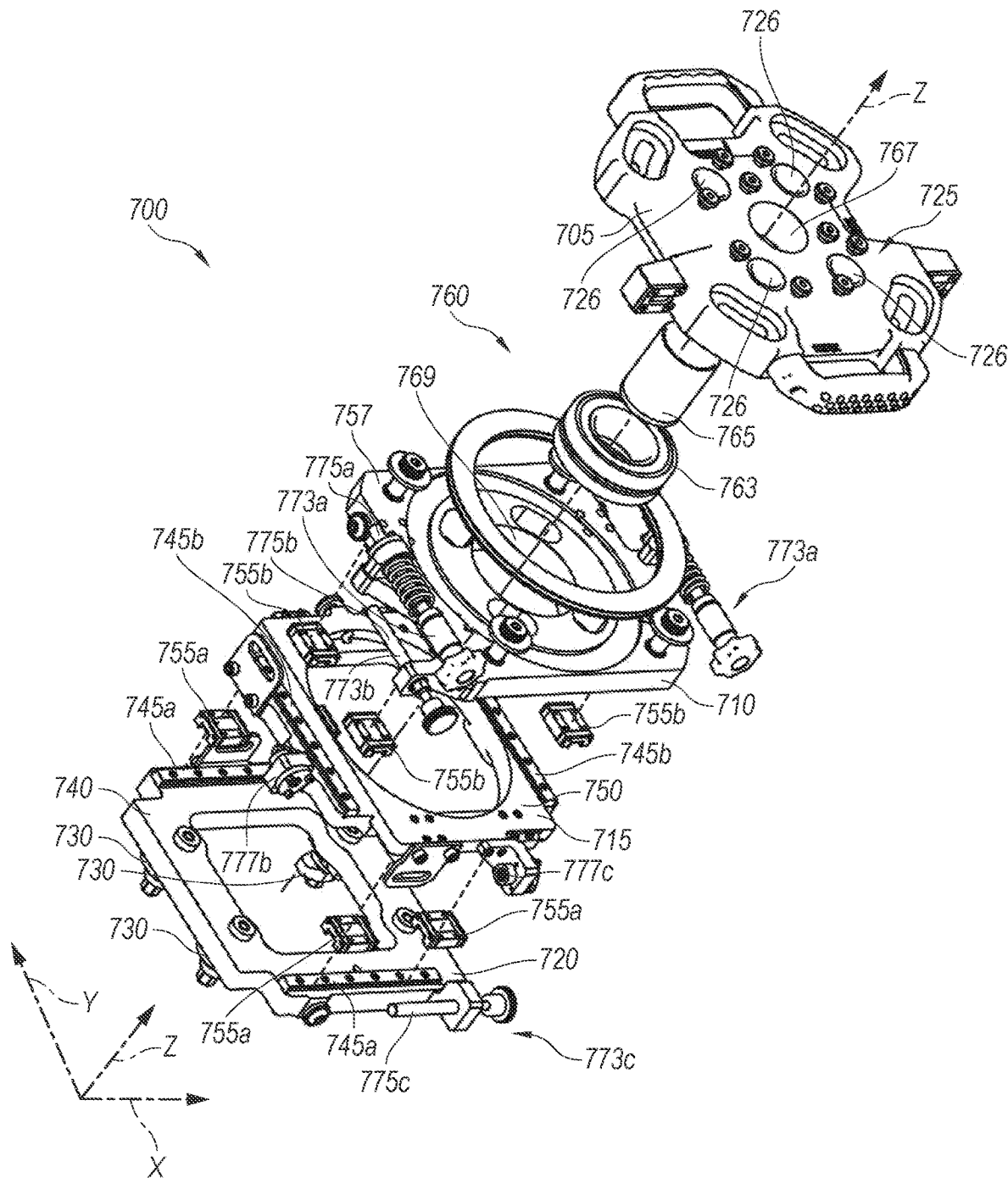

FIGS. 7A, 7B, and 7C illustrate partially schematic views of a drill jig 700 configured in accordance with embodiments of the present technology. FIG. 7A illustrates a partially schematic perspective view, FIG. 7B illustrates a partially schematic bottom view, and FIG. 7C illustrates an exploded view. The function of the drill jig 700 is to provide and align a template for drilling the mounting holes 330 (see FIG. 3).

With reference to FIGS. 7A, 7B, and 7C, the drill jig 700 can include a rotatable top plate 705, a first translatable plate 710, a second translatable plate 715, and a base plate 720. The rotatable top plate 705, the first translatable plate 710, and the second translatable plate 715 are movable relative to each other and relative to the base plate 720 to position and align a hole pattern 725 formed with a plurality of through-holes 726 in the rotatable top plate 705 for drilling and/or cutting the mounting holes 330 according to the mounting hole pattern 320 (see FIG. 3 and the corresponding description above). Accordingly, the hole pattern 725 in the rotatable top plate 705 can correspond to the mounting hole pattern 320 in terms of the position and/or number of mounting holes 330. Aspects of the plates 705, 710, 715, 720 are described in further detail below.

With specific reference to FIG. 7B, the base plate 720 can include one or more attachment elements 730 (such as a plurality of attachment elements 730, for example, four attachment elements 730) positioned to grasp the attachment feature 160 to securely hold the drill jig 700 on one of the attachment features 160 (see FIGS. 1-6B). In some embodiments, the attachment elements 730 can include swivel clamps or other attachment devices suitable for securely holding the base plate 720 on the attachment feature 160 (with or without a shim 300 on the attachment feature 160). A bottom surface 735 of the base plate 720 is positioned and configured to press against one of the mounting faces 310 of the shims 300 (see FIG. 6B) while the attachment elements 730 can engage (e.g., grasp) an underside of the mounting face 200 of the attachment feature 160. With specific reference to FIG. 7C, a top surface 740 of the base plate 720 can include and/or carry one or more rail elements 745a positioned and configured to facilitate translational motion of the second translatable plate 715 relative to the base plate 720 along a first axis X.

With continuing reference to FIG. 7C, the second translatable plate 715 includes a top surface 750 and a bottom surface positioned opposite the top surface 750 (the bottom surface is not visible in FIG. 7C). The second translatable plate 715 can be connected to the rail elements 745a via one or more rail cars 755a positioned and configured to engage (i.e., ride) each rail element 745a. The rail cars 755a can be attached to the bottom side of the second translatable plate 715 (dashed lines in FIG. 7C illustrate some of the connections). When the second translatable plate 715 is connected to the rail cars 755a and the rail cars 755a are on the rail elements 745a, the second translatable plate 715 can translate relative to the base plate 720 along the rail elements 745a to provide the first axis X of adjustment of the drill jig 700. Although rails and rail cars can be implemented in some embodiments, other embodiments can include other suitable translation mechanisms for facilitating translational movement of the second translatable plate 715 relative to the base plate 720.

The first translatable plate 710 can be movable relative to the second translatable plate 715 in a manner similar to the movement of the second translatable plate 715 relative to the base plate 720, but along a different axis. For example, the top surface 750 of the second translatable plate 715 can include and/or carry one or more rail elements 745b positioned and configured to facilitate translational motion of the first translatable plate 710 relative to the second translatable plate 715. The rail elements 745b on the second translatable plate 715 can be oriented transversely (for example, perpendicularly) relative to the rail elements 745a on the base plate 720, so that movement of the first translatable plate 710 relative to the second translatable plate 715 is along a second axis Y that is transverse (for example, oblique or perpendicular) to the first axis X.

The first translatable plate 710 includes a top surface 757 and a bottom surface positioned opposite the top surface 757 (the bottom surface is not visible in FIG. 7C). The first translatable plate 710 can be connected to the rail elements 745b on the second translatable plate 715 via one or more rail cars 755b positioned and configured to ride each rail element 745b on the second translatable plate 715. The rail cars 755b can be attached to the bottom side of the first translatable plate 710 (dashed lines in FIG. 7C illustrate some of the connections, and the rail cars 755b can be seen in FIG. 7C having an orientation that aligns with the corresponding rail elements 745b). When the first translatable plate 710 is connected to the rail cars 755b and the rail cars 755b are on the rail elements 745b of the second translatable plate 715, the first translatable plate 710 can translate relative to the second translatable plate 715 along the rail elements 745b to provide the second axis Y of adjustment of the drill jig 700. Although rails and rail cars can be implemented in some embodiments, other embodiments can include other suitable translation mechanisms for facilitating translational movement of the first translatable plate 710 relative to the second translatable plate 715.

The rotatable top plate 705 is attached to the first translatable plate 710 by a rotatable connection mechanism 760. Accordingly, the rotatable top plate 705 is positioned and configured to rotate relative to the first translatable plate 710 about a third axis Z, which can be orthogonal to the first axis X and the second axis Y. In some embodiments, the rotatable connection mechanism 760 includes a bearing element 763 connected to the rotatable top plate 705 and the first translatable plate 710. In some embodiments, the bearing element 763 can be connected to the rotatable top plate 705 via a bushing 765 press-fit into a central bore 767 in the rotatable top plate 705 and into the bearing element 763, or via another suitable connection. In some embodiments, the bearing element 763 can be connected to the translatable plate 710 by being press-fit into a central bore 769 in the first translatable plate 710. In some embodiments, the central bore 769 can form at least part of the hole pattern 725 along with the through-holes 726. In some embodiments, the rotatable top plate 705 can be attached to the first translatable plate 710 by another suitable rotatable connection mechanism 760 that facilitates rotation of the rotatable top plate 705 relative to the first translatable plate 710. In some embodiments, bushings 771 can be press-fit into the through-holes 726 to protect the through-holes 726 during drilling.

The hole pattern 725 can be positioned by moving the rotatable top plate 705, the first translatable plate 710, and the second translatable plate 715 relative to the base plate 720 when the drill jig 700 is attached to one of the attachment features 160 (see FIGS. 1-6B). A drill or other cutting device cuts the mounting holes 330 through the hole pattern 725. Accordingly, the drill jig 700 can provide translational adjustment of the hole pattern 725 along the first axis X and the second axis Y, and rotational adjustment of the hole pattern 725 about the third axis Z.

With reference to each of FIGS. 7A, 7B, and 7C, to adjust the hole pattern 725, in some embodiments, the drill jig 700 can include one or more adjusters (e.g., adjusters 773a, 773b, 773c) configured and positioned to cause relative movement between the plates 705, 710, 715, 720. In some embodiments, the adjusters can include lead screw assemblies, ball screw assemblies, linear actuators, and/or other suitable mechanisms for causing the relative movement. The adjusters can be operated in any order and/or sequence.

For example, the drill jig 700 can include one or more rotational adjusters 773*a* for rotational adjustment of the rotatable top plate 705 relative to the first translatable plate 710 (e.g., around the third axis Z). In some embodiments, each rotational adjuster 773*a* can include a lead screw 775*a* carried by the rotational top plate 705 and positioned to rotate within and engage a threaded nut 777*a* fixed to the first translatable plate 710. Rotation of the lead screw 775*a* causes the rotational top plate 705 to rotate about the third axis Z. In some embodiments, the rotational adjuster 773*a* includes one or more relief devices positioned to allow the rotational adjuster 773*a* to move relative to the remainder of the drill jig 700 so that rotation of the rotatable top plate 705 is not limited by a rigid connection between the rotational adjuster 773*a*, the rotatable top plate 705, and the first translatable plate 710.

The drill jig 700 can further include a first translational adjuster 773*b* for adjusting the first translatable plate 710 relative to the second translatable plate 715 (e.g., along the second axis Y). In some embodiments, the first translational adjuster 773*b* can include a lead screw 775*b* carried by the first translatable plate 710 and positioned to rotate within and engage a threaded nut 777*b* fixed to the second translatable plate 715. Rotation of the lead screw 775*b* causes the first translatable plate 710 to translate (e.g., slide) relative to the second translatable plate 715 (for example, via the rail elements 745*b* due to the linear force provided by the lead screw 775*b* pushing or pulling against the threaded nut 777*b*.)

The drill jig 700 can further include a second translational adjuster 773*c* for adjusting the second translatable plate 715 relative to the base plate 720 (e.g., along the first axis X). In some embodiments, the second translational adjuster 773*c* can include a lead screw 775*c* carried by the base plate 720 and positioned to rotate within and engage a threaded nut 777*c* fixed to the second translatable plate 715. Rotation of the lead screw 775*c* causes the second translatable plate 715 to translate (e.g., slide) relative to the base plate 720 (for example via the rail elements 745*a* due to the linear force provided by the lead screw 775*c* pushing or pulling against the threaded nut 777*c*).

In some embodiments, the threaded nuts 777*a*, 777*b*, 777*c* and their corresponding lead screws 775*a*, 775*b*, 775*c* can be in other locations within the drill jig 700, such that a nut is on a different plate than described above, and the lead screw is on the other corresponding plate.

Figure 8:
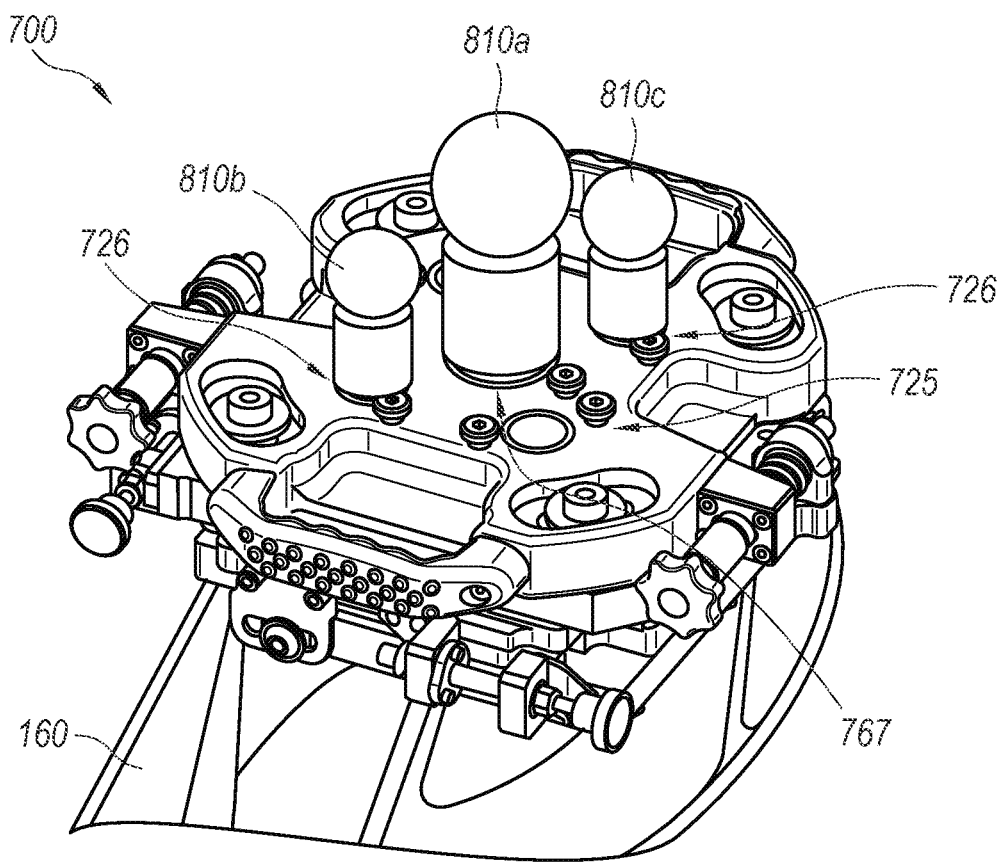
FIG. 8 illustrates a partially schematic perspective view of a drill jig attached to an attachment feature, in accordance with embodiments of the present technology.

FIG. 8 illustrates a partially schematic perspective view of a drill jig 700 attached to an attachment feature 160, in accordance with embodiments of the present technology (for example, via the attachment elements 730, see FIGS. 7B and 7C). To position the hole pattern 725, the system can include one or more optical targets 810*a*, 810*b*, 810*c* permanently or temporarily carried by the drill jig 700 (e.g., in one or more receptacles for receiving or supporting one or more optical targets). For example, in some embodiments, a first optical target 810*a* can be positioned in the central bore 767, a second optical target 810*b* can be positioned in one of the through-holes 726, and a third optical target 810*c* can be positioned in another one of the through-holes 726. The first optical target 810*a* can facilitate positioning along the first (X) and second (Y) axes (see FIG. 7A). The second optical target 810*b* and/or the third optical target 810*c* can facilitate rotation about the third axis Z (also called "clocking") (see FIG. 7A). In some embodiments, translation (X-Y) is adjusted first, followed by rotation (about Z), although other embodiments can include other sequences of adjustment.

Figure 9:
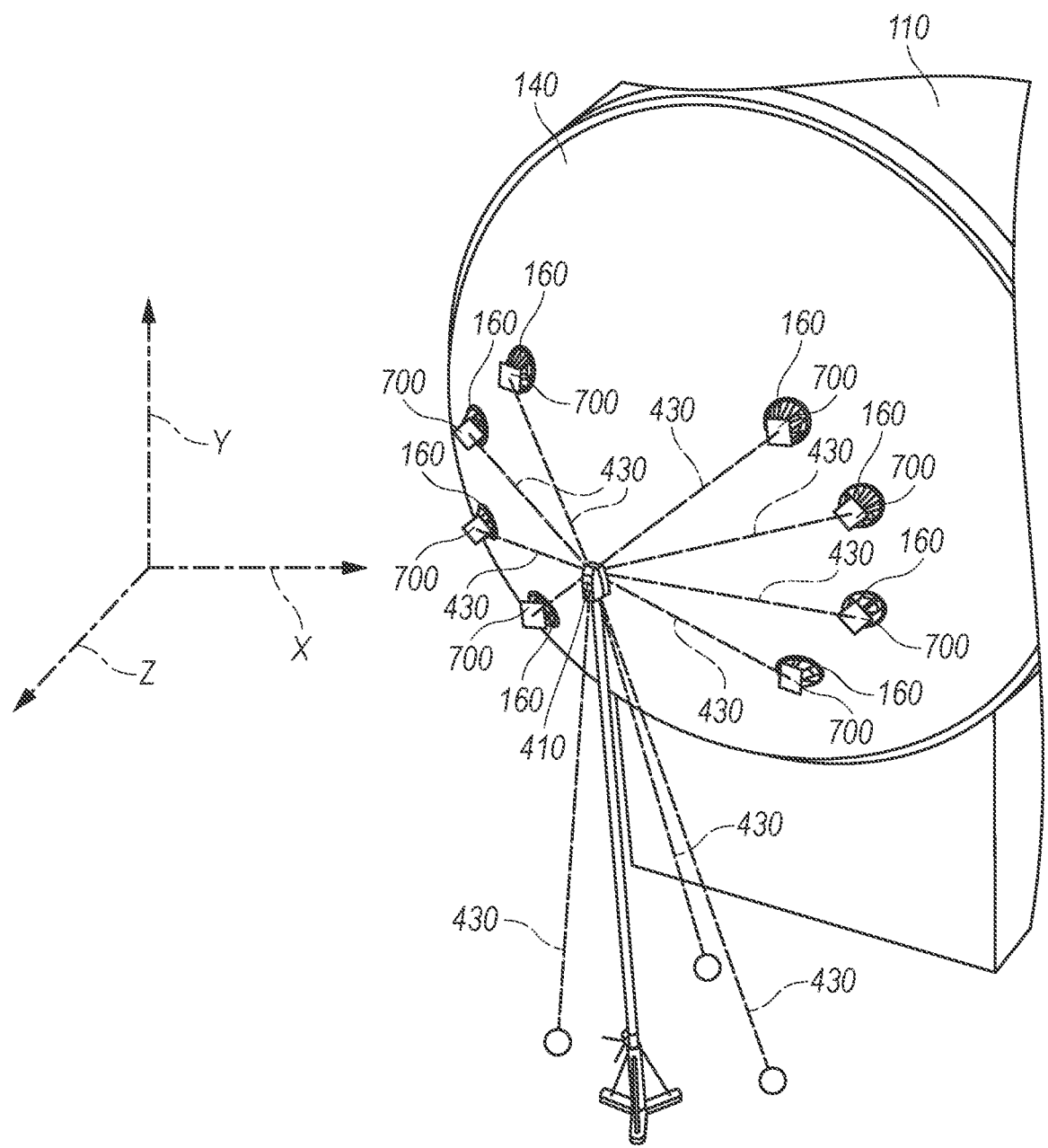
FIG. 9 illustrates a partially schematic perspective view of a step in a process of aligning one or more drill jigs using a measurement system, in accordance with embodiments of the present technology.

FIG. 9 illustrates aligning one or more of the drill jigs 700 using the measurement system 410. The measurement system 410 tracks the position and/or orientation of the optical targets 810*a*, 810*b*, and/or 810*c* (see FIG. 8) within the reference coordinate system created in the step associated with FIG. 4, to align the hole pattern 725 (see FIG. 7A) to its nominal position as required by design specifications. Then, the optical targets 810*a*, 810*b*, 810*c* can be removed from the drill jig(s) 700, and a drill or other cutting device can drill or cut through the shim 300 and/or the mounting face 200 of each attachment feature 160 to create the hole pattern 320 (see FIG. 3). Then, with reference to FIGS. 1 and 2, each leg 170 of the thrust structure 120 can be fastened to the corresponding attachment feature 160 (using bolts or rivets, for example).

Figure 10:
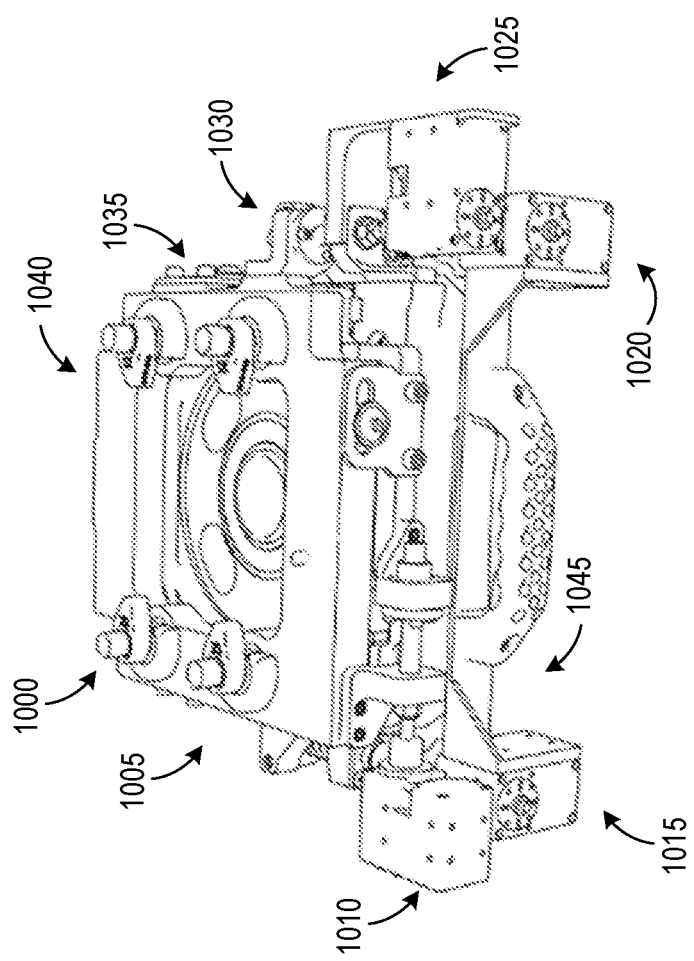
FIG. 10 illustrates a partially schematic perspective view of a drill jig 1000 configured in accordance with additional embodiments of the present technology

FIG. 10 illustrates a partially schematic perspective view of a drill jig 1000 configured in accordance with additional embodiments of the present technology. In some embodiments, the drill jig 1000 can be generally similar to the drill jig 700 described above with regard to FIGS. 7A-9, but it can further include a servo system for computer and/or automated control of movements of the translatable and/or rotatable plates along and/or about the axes of the drill jig 1000. For example, in some embodiments, the servo system can include one or more (such as four) servo motors 1010, 1015, 1020, 1025 for driving movement of one or more of the rotatable and/or translatable plates described above. In some embodiments, the drill jig 1000 can include a microcontroller 1035 (which can optionally be wired or wireless) for controlling the servo motors and/or for communicating with an external computer (e.g., for receiving commands and/or for reporting feedback). In some embodiments, the drill jig 1000 can include a battery pack 1040 and/or another power source such as a connection point to external power, for powering the servo motors, the microcontroller, and/or other aspects of the drill jig 1000.

In some embodiments, the drill jig 1000 can include one or more encoders for observing and/or measuring movement along and/or about each of the X, Y, and Z axes. The encoders may be internal or external to the drill jig 1000, and they may include linear encoders and/or other suitable encoders. For example, in some embodiments, the drill jig 1000 can include a first encoder 1045 for the X axis, a second encoder 1030 for the Y axis, and/or a third encoder 1005 for the Z axis. In some embodiments, the computer system 440 can operate and/or otherwise control the drill jig 1000 via the microcontroller 1035, servo motors 1010, 1015, 1020, 1025, and the encoders 1030, 1045, 1005. In some embodiments, the computer system 440 and/or another computer system can perform closed-loop positioning and/or orientation of the rotatable and/or translatable plates of the drill jig 1000 for fast and precise positioning of the hole pattern in the drill jig 1000 (which may be similar to the hole pattern 725 described above with regard to the drill jig 700 in FIGS. 7A-9).

Figure 11:
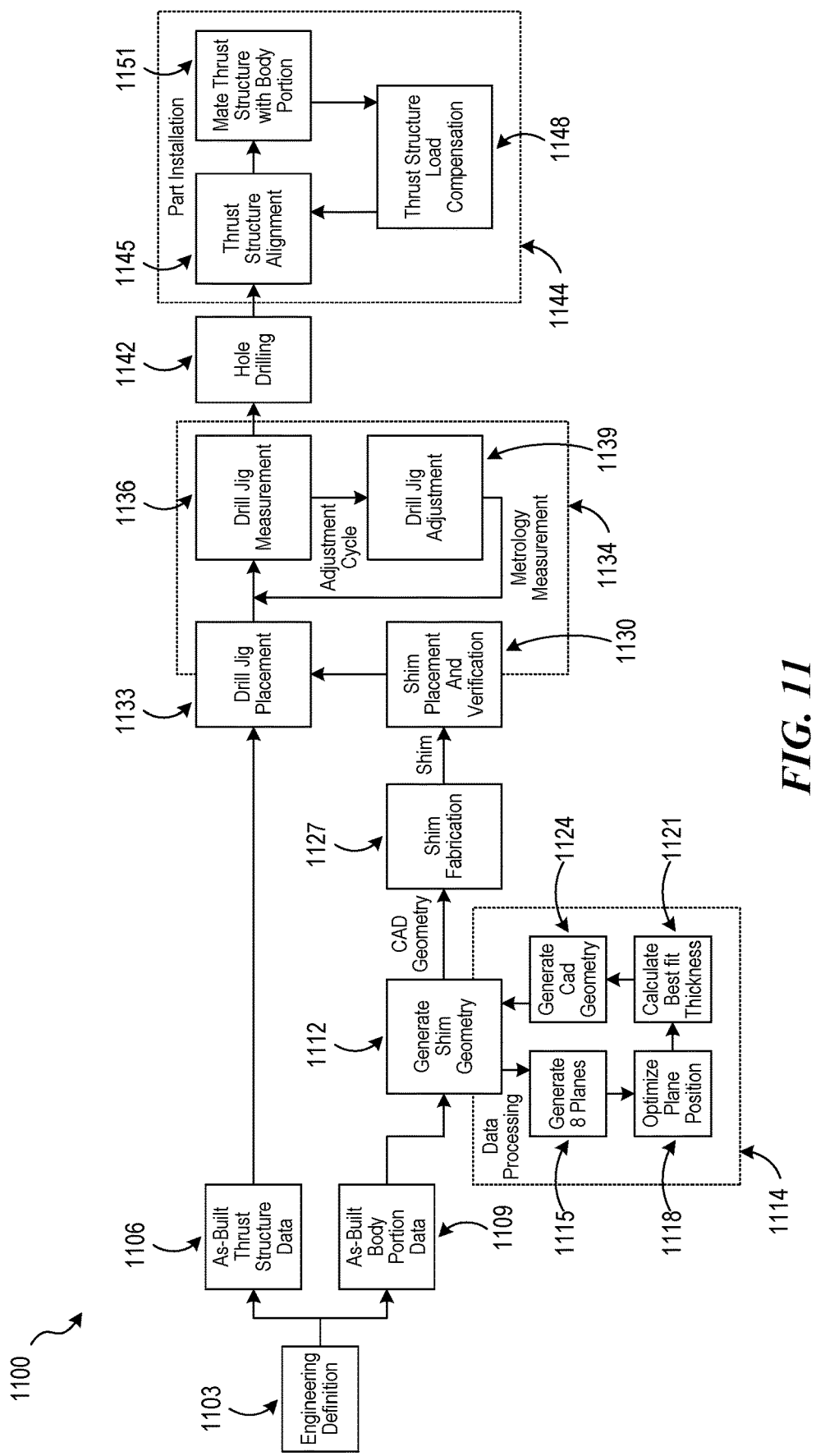
FIG. 11 illustrates a flow diagram for a process for attaching a thrust structure to a body portion or another object, in accordance with embodiments of the present technology.

FIG. 11 illustrates a flow diagram for a process 1100 for attaching a thrust structure (e.g., the thrust structure 120 described above) to a body portion 110 or another object in accordance with embodiments of the present technology. At block 1103, engineers can build the thrust structure 120 and the body portion 110. At blocks 1106 and 1109, the process 1100 can include measuring the thrust structure and the body portion using metrology systems and techniques such as those described above with regard to FIGS. 4 and 5, for example, to generate data for the as-built (real world) condition of the thrust structure (block 1106) and the body portion (block 1109).

At block 1112, the process 1100 can include calculating the dimensions and geometry of one or more of the shims 300. In some embodiments, calculating the dimensions and geometry of the shims 300 can include a process 1114 which can include: at block 1115, using computer-aided design software to generate a number of planes corresponding to the number of attachment features 160 (e.g., eight planes for eight mounting feet); at block 1118, virtually aligning the planes (e.g., optimizing their positions to correspond with the nominal/desired mounting interface positions, which can correspond with the positions of the new mounting faces 310); at block 1121, calculating necessary and/or desired thicknesses of the shims 300 using a best-fit technique or another suitable technique; and at block 1124, generating computer-aided design model geometry for each shim 300. At block 1127, the process 1100 can include fabricating the shims 300 by any suitable method (e.g., machining).

At block 1130, the shims 300 can be positioned on the mounting faces 200 of the attachment features 160 and verified for fit and accuracy. In some embodiments, this can include obtaining additional measurements using the techniques described above, or other suitable techniques. For example, verification can include ensuring that the new mounting faces 310 are coplanar or otherwise positioned as required by the design and/or by tolerances. The process 1100 can continue with a process 1134 for placing and adjusting the position(s) of the drill jig (e.g., 700, 1000). For example, at block 1133, the process 1134 can further include positioning the drill jig (e.g., 700, 1000) on the new mounting faces 310, and then performing a loop of measurement and adjustment until the hole pattern 725 is in its nominal/desired position. Measurement and adjustment of the drill jig can be performed manually (e.g., using the drill jig 700 described above with regard to FIGS. 7A-8), and/or automatically (e.g., using the drill jig 1000 described above with regard to FIG. 10). Specifically, the loop can include: at block 1136, measuring the drill jig position (e.g., as described above using metrology techniques); and at block 1139, adjusting the drill jig, until the hole pattern 725 is in its nominal/desired position. Then, at block 1142, operators can drill the holes in the shims 300 and the attachment features 160 using the hole pattern 725 in the drill jig (e.g., the drill jig 700 or 1000).

The process 1100 can further include a process 1144 for installing the thrust structure on the body portion. For example, at block 1145, operators can align the thrust structure 120 to the body portion 110 (specifically, for example, the attachment features 160 on the head 140), and at block 1151, the thrust structure 120 can be mated to the body portion 110 as explained above (e.g., with fasteners). In some embodiments, the mating process can include, at block 1148, compensating for the load of the thrust structure using a load sensing system to measure the forces on the thrust structure 120 and/or the body portion 110 to gently align the thrust structure 120 to the body portion 110 to its correct final position. The alignment and load compensation steps can be performed in a loop until the thrust structure is attached to the body portion 110 within the desired position and load-bearing specifications. In some embodiments, the mating and alignment process 1144 can include using one or more metrology processes to align the thrust structure to the body portion.

Figure 12:
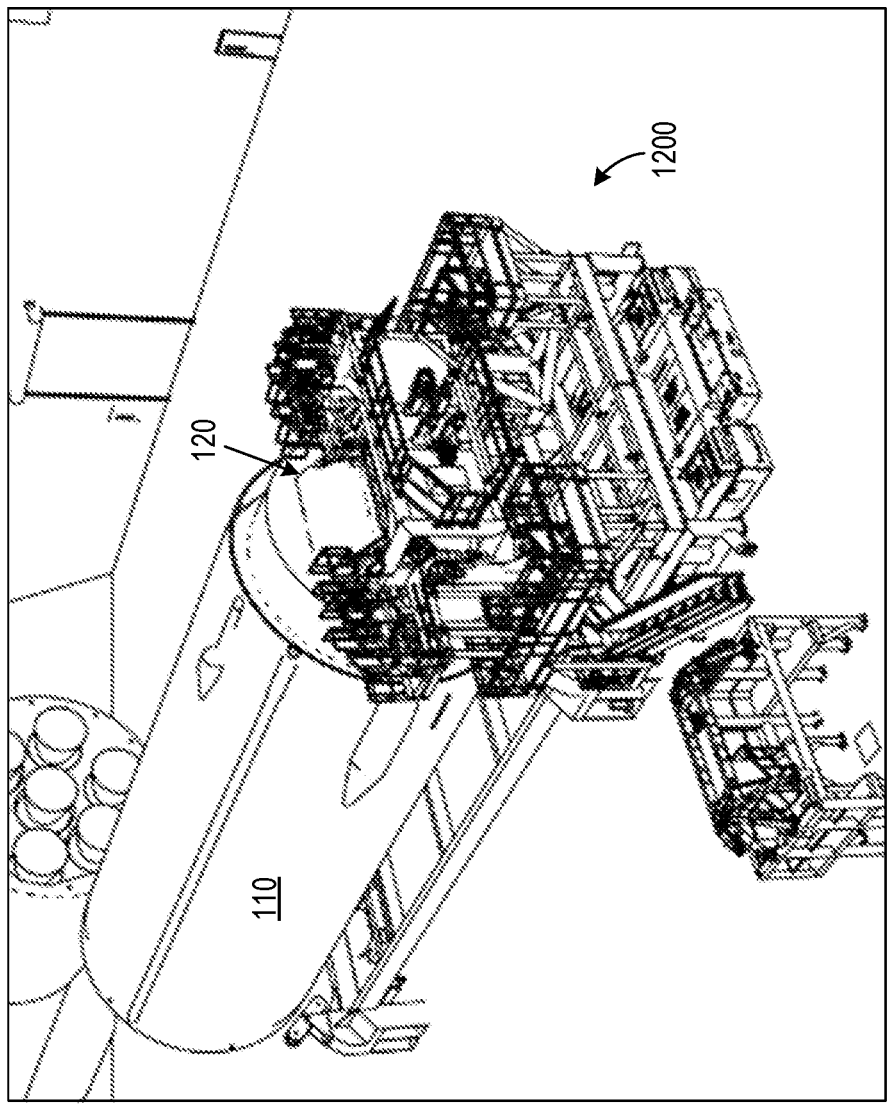
FIG. 12 illustrates a schematic rear perspective view of a load sensing and positioning system configured for detecting loads on the thrust structure and/or the body portion during the mating process, and for supporting and/or manipulating the thrust structure into its final position.

FIG. 12 illustrates a schematic rear perspective view of a load sensing and positioning system 1200 configured for detecting loads on the thrust structure 120 and/or the body portion 110 during the mating process, and for supporting and/or manipulating the thrust structure 120 into its final position. The load sensing and positioning system 1200 can include any suitable load measurement devices (e.g., load cells), actuators, and/or support structures for moving the thrust structure 120 and providing force feedback for accurate positioning. The load sensing and positioning system 1200 can be connectable and/or controlled by the one or more computer systems 440.

From the foregoing, it will be appreciated that specific embodiments of the disclosed technology have been described herein for purposes of illustration, but that various modifications may be made without deviating from the technology. For example, although the thrust structure 120 can carry components of a propulsion system and transfer thrust forces, in some embodiments, the thrust structure 120 can be a mounting structure for carrying other objects or components of a system. Accordingly, embodiments of the present technology can include any suitable system in which a structure is mounted to a head of a tank or another large structure that is otherwise difficult to build with tight tolerances. Embodiments of the present technology can position any two or more parts together in a way that mitigates hardware variation by shimming it out, and by detaching the hole pattern from the detail parts by usage of a drill jig. In general, any industry utilizing bolted joints on large structural items (aerospace or otherwise) can use embodiments of this process to join a first part to a second part. In some embodiments, the coordinate measurement data can be used to program automated positioning systems to integrate the items. In some embodiments, the step of aligning real-world measurements to the nominal CAD model can be performed after the measurement system 410 measures/characterizes the real-world attachment features. Although features can be aligned to nominal positions/conditions (e.g., CAD positions), in some embodiments, features can be aligned to as-built conditions and/or a mixture of as-built conditions and nominal conditions/positions.

Although specific quantities, dimensions, or other numerical characterizations are provided for context and/or to indicate representative embodiments, various further embodiments can have other quantities, sizes, or characteristics (for example, sizes, quantities, and/or characteristics commensurate with strength requirements or other variables). Although the mounting faces (e.g., 200, 310) have been described herein as being coplanar and/or flat, in some embodiments, the mounting faces may have other characteristics. In general, embodiments of the present technology facilitate alignment of new mounting faces to a nominal desired configuration to enable precision assembly and tight tolerances (e.g., Class 1, where for example, a hole diameter may be within 0.005 inches of a corresponding fastener diameter).

Certain aspects of the technology described in the context of particular embodiments may be combined or eliminated in other embodiments. Further, while advantages associated with certain embodiments of the disclosed technology have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

As used herein, the term "and/or" when used in the phrase "A and/or B" means "A, or B, or both A and B." A similar manner of interpretation applies to the term "and/or" when used in a list of more than two terms. As used herein, the terms "generally" and "approximately" refer to values or characteristics within a range of ±10% from the stated value or characteristic, unless otherwise indicated.

Many embodiments of the technology described herein may take the form of computer- or controller-executable instructions, including routines executed by a programmable computer or controller. Those skilled in the relevant art will appreciate that the technology can be practiced on computer/controller systems other than those shown and described herein. The technology can be embodied in a special-purpose computer, controller, or data processor that is specifically programmed, configured, or constructed to perform one or more of the computer-executable instructions described herein. Accordingly, the terms "computer" and "controller" as generally used herein refer to any data processor and can include Internet appliances and hand-held devices (including palm-top computers, wearable computers, cellular or mobile phones, multiprocessor systems, processor-based or programmable consumer electronics, network computers, mini computers, and the like). Information handled by these computers can be presented at any suitable display medium, including an LCD.

The technology can also be practiced in distributed environments, where tasks or modules are performed by remote processing devices that are linked through a communications network (e.g., a wireless communication network, a wired communication network, a cellular communication network, the Internet, and/or a short-range radio network such as Bluetooth). In a distributed computing environment, program modules and/or subroutines may be located in local and remote memory storage devices. Aspects of the technology described herein may be stored and/or distributed on computer-readable media, including magnetic or optically readable or removable computer disks, as well as distributed electronically over networks. Data structures and transmissions of data particular to aspects of the technology are also encompassed within the scope of the embodiments of the technology.

We claim:

1. A method of assembling an aerospace system, the method comprising:
    positioning a plurality of optical targets on a body portion of the aerospace system;
    directing a light beam from a measurement system toward each of the optical targets;
    determining a position and orientation of the measurement system relative to the body portion in a reference coordinate system, wherein determining the position comprises determining a distance between the measurement system and each of the optical targets using the measurement system;
    within the reference coordinate system, and using the measurement system, scanning and characterizing a plurality of first mounting faces on attachment features positioned on the body portion;
    forming a digital representation of each of the first mounting faces within the reference coordinate system;
    based on the digital representation of each of the first mounting faces, defining one or more shims, wherein when each shim is positioned on a corresponding first mounting face, the shim forms a corresponding new mounting face, wherein each of the new mounting faces are coplanar within the reference coordinate system;
    positioning each shim on each corresponding first mounting face;
    positioning a drill jig over a selected shim from the one or more shims, on the new mounting face, wherein the drill jig comprises a hole pattern;
    adjusting the drill jig to position the hole pattern within the reference coordinate system, using the measurement system; and
    making holes based on the hole pattern.

2. The method of claim 1, wherein the drill jig comprises one or more attachment elements, and wherein positioning the drill jig comprises attaching the drill jig to the attachment feature on which the selected shim is positioned.

3. The method of claim 1, wherein the drill jig comprises a plurality of movable plates, and wherein adjusting the drill jig comprises:
    positioning one or more second optical targets in the hole pattern;
    tracking, with the measurement system, a position of each of the one or more second optical targets within the reference coordinate system; and
    moving one or more of the plurality of movable plates to align the hole pattern with a hole pattern position within the reference coordinate system.

4. The method of claim 1, wherein the system comprises a thrust structure comprising a plurality of legs, and wherein the method further comprises:
    attaching each leg to a first mounting face or a new mounting face.

5. The method of claim 1, wherein positioning each shim on each corresponding first mounting face comprises attaching each shim to each corresponding first mounting face with adhesive or tape.

6. The method of claim 1, wherein positioning the plurality of optical targets on the body portion comprises positioning the plurality of optical targets around a perimeter of the body portion.

7. A method of assembling an aerospace system, the method comprising:
    positioning a constellation of targets on a body portion of the aerospace system; using a measurement system, determining a distance between the measurement system and each of the targets;
    determining a position and orientation of the measurement system relative to the targets in a reference coordinate system;
    within the reference coordinate system, using the measurement system, measuring two or more first mounting faces attached to the body portion;
    forming a digital representation of each of the first mounting faces within the reference coordinate system;
    based on the digital representation of each of the first mounting faces, defining one or more shims, wherein each shim is configured to be positioned on a corresponding first mounting face to form a second mounting face, wherein each second mounting face is coplanar with a first mounting face and/or another second mounting face within the reference coordinate system;
    positioning each shim on each corresponding first mounting face; and
    forming one or more mounting holes in each shim and each corresponding mounting face, based on a hole pattern within the reference coordinate system.

8. The method of claim 7, wherein forming the mounting holes comprises positioning a drill jig on each shim, wherein the drill jig comprises the hole pattern, and wherein the method further comprises adjusting the drill jig to position the hole pattern within the reference coordinate system.

9. The method of claim 7, wherein the system comprises a thrust structure comprising a plurality of legs, and wherein the method further comprises attaching each leg to a first mounting face or a second mounting face.

10. The method of claim 7, wherein positioning each shim on each corresponding first mounting face comprises attaching each shim to each corresponding mounting face with adhesive or tape.

11. The method of claim 7, wherein the first targets comprise optical targets, and wherein using the measurement system comprises emitting a light beam toward the optical targets.

12. A method of assembling a structure, the method comprising:
    selecting a reference coordinate system;
    within the reference coordinate system, and using a measurement system, scanning and characterizing an attachment feature positioned on a first structural element;
    forming, in a computing system, a digital representation of the attachment feature within the reference coordinate system;
    based on the digital representation of the attachment feature, defining a shim, wherein when the shim is positioned on the attachment feature, the shim forms a new mounting face that is positioned in a nominal location;
    positioning the shim on the attachment feature;
    positioning a drill jig over the shim and on the new mounting face, wherein the drill jig comprises a hole pattern;
    adjusting the drill jig to position the hole pattern, using the measurement system; and making holes based on the hole pattern.

13. The method of claim 12, further comprising attaching a second structural element to the first structural element via the attachment feature and the shim.

14. The method of claim 13, wherein:
    the structure is an aerospace structure;
    the first structural element is one of (a) a head of a propellant tank or (b) a thrust structure configured to support a rocket engine; and
    the second structural element is the other of (a) the head of a propellant tank or (b) the thrust structure.

15. The method of claim 13, wherein attaching the second structural element to the first structural element comprises supporting the second structural element in a structure comprising one or more load measurement devices, wherein the method comprises using force-feedback to align the second structural element to the first structural element.

16. The method of claim 13, wherein attaching the second structural element to the first structural element comprises using one or more metrology processes to align the second structural element to the first structural element.

* * * * *